(12) United States Patent
Wei et al.

(10) Patent No.: US 9,093,947 B2
(45) Date of Patent: Jul. 28, 2015

(54) ZERO-VOLTAGE-SWITCHING (ZVS) PIEZOELECTRIC DRIVING CIRCUIT

(71) Applicants: MIDAS WEI TRADING CO., LTD., Taipei (TW); CHAMPION ELITE COMPANY LIMITED, Tortola (VG)

(72) Inventors: Tao-Chin Wei, Taipei (TW); Yuan-Ping Liu, Taipei (TW)

(73) Assignees: MIDAS WEI TRADING CO., LTD., Taipei (TW); CHAMPION ELITE COMPANY LIMITED, Road Town, Tortola (VG)

( * ) Notice: Subject to any disclaimer, the term of this patent is extended or adjusted under 35 U.S.C. 154(b) by 161 days.

(21) Appl. No.: 13/729,942

(22) Filed: Dec. 28, 2012

(65) Prior Publication Data

US 2013/0169198 A1      Jul. 4, 2013

(30) Foreign Application Priority Data

Dec. 30, 2011      (TW) .............................. 100149933 A (51) Int. Cl.
   *H02P 31/00*      (2006.01)
   *H05B 41/282*     (2006.01)
   *H01L 41/04*      (2006.01)

(52) U.S. Cl.
   CPC .............. *H02P 31/00* (2013.01); *H01L 41/044* (2013.01); *H05B 41/2827* (2013.01)

(58) Field of Classification Search
   CPC .... H01L 41/044; H02P 31/00; H05B 41/2827
   USPC .................... 318/116, 36; 310/300, 311, 315, 310/316.01, 317, 318, 321, 322, 323.06, 310/334, 342, 316.03; 315/306, 310, 299; 323/220, 222, 232
   See application file for complete search history.

(56) References Cited

U.S. PATENT DOCUMENTS

| | | | | |
|---|---|---|---|---|
| 3,636,386 A | * | 1/1972 | Kawada ........................ | 310/318 |
| 5,705,877 A | * | 1/1998 | Shimada ....................... | 310/318 |
| 5,859,489 A | * | 1/1999 | Shimada ....................... | 310/318 |
| 5,923,542 A | * | 7/1999 | Sasaki et al. ................... | 363/16 |
| 6,133,672 A | * | 10/2000 | Sasaki et al. ................... | 310/318 |
| 6,151,231 A | * | 11/2000 | Saint-Pierre et al. ........... | 363/95 |

(Continued)

OTHER PUBLICATIONS

Y.P. Liu, D. Vasic and F. Costa. "Wideband ZVS half-bridge circuit for piezoelectric transformers with small inductance." Electronics Letters Apr. 26, 2012 vol. 48 No. 9.*

(Continued)

*Primary Examiner* — Rita Leykin
(74) *Attorney, Agent, or Firm* — Muncy, Geissler, Olds & Lowe, P.C.

(57) ABSTRACT

A zero-voltage-switching (ZVS) piezoelectric driving circuit, suitable for use in a switching type power converter. It receives an input DC voltage from a half-bridge driving circuit, and through switching of an high-side switch set and a low-side switch set of the half-bridge driving circuit, converts it to an AC voltage and provides it to a piezoelectric element to drive a load. Wherein, a shunt circuit is connected electrically between the half-bridge driving circuit and the piezoelectric element for zero-voltage-switching (ZVS). Namely, when the high-side switch set and the low-side switch set are both switched off, the shunt circuit resonates with its parasitic capacitance, so that the high-side switch set and the low-side switch set perform ZVS, thus realizing ZVS in a wide range of frequency and a large range of load.

8 Claims, 6 Drawing Sheets

(56) References Cited

U.S. PATENT DOCUMENTS

| | | | | |
|---|---|---|---|---|
| 6,153,962 | A * | 11/2000 | Noma et al. | 310/316.01 |
| 6,504,734 | B2 * | 1/2003 | Navas Sabater et al. | 363/24 |
| 7,847,491 | B2 * | 12/2010 | Lin et al. | 315/307 |
| 7,969,754 | B2 * | 6/2011 | Radecker et al. | 363/21.03 |
| 8,063,717 | B2 * | 11/2011 | Bradley et al. | 333/133 |
| 8,193,877 | B2 * | 6/2012 | Fritz et al. | 333/133 |
| 8,400,100 | B2 * | 3/2013 | Takizawa et al. | 318/803 |
| 2005/0281061 | A1 * | 12/2005 | Radecker et al. | 363/21.02 |
| 2009/0039798 | A1 * | 2/2009 | Siessegger | 315/276 |

OTHER PUBLICATIONS

Yuan-Ping Liu et al., "Design of fixed frequency controlled radial-mode stacked disk-type piezoelectric transformers for DC/DC converter applications," *Smart Materials and Structures*, vol. 18 (2009), 13 pages.

Wei-Chuan Su et al., "ZVS for PT Backlight Inverter Utilizing High-Order Current Harmonic," *IEEE Transactions on Power Electronics*, vol. 23, No. 1, Jan. 2008, pp. 4-10.

Ray-Lee Lin, "Piezoelectric Transformer Characterization and Application of Electronic Ballast," Dissertation submitted to the Faculty of the Virginia Polytechnic Institute and State University in partial fulfillment of the requirement for the degree of Doctor of Philosophy in Electrical Engineering, Nov. 26, 2001, 171 pages.

Y.P. Liu et al., "Wideband ZVS half-bridge circuit for piezoelectric transformers with small inductance," *Electronics Letters*, Apr. 26, 2012, vol. 48, No. 9, 2 pages.

* cited by examiner

ZERO-VOLTAGE-SWITCHING (ZVS) PIEZOELECTRIC DRIVING CIRCUIT

BACKGROUND OF THE INVENTION

1. Field of the Invention

The present invention relates to a zero-voltage-switching (ZVS) piezoelectric driving circuit, and in particular to a piezoelectric driving circuit of a Zero-Voltage-Switching (ZVS) half-bridge circuit, capable of operating in a wide bandwidth and in a wide range of load.

2. The Prior Arts

Due to its advantages of compact size, thin profile, and free of Electromagnetic Interference (EMI), the piezoelectric transformer has been used extensively in the power driving circuits. However, the piezoelectric transformer still has insurmountable problems. By way of example, in applying a piezoelectric transformer into a bridge switching circuit, usually, an inductor has to be connected between the bridge switching circuit and the piezoelectric transformer, to achieve Zero-Voltage-Switching. However, the inductor itself is thicker than the piezoelectric transformer (namely, having a larger dimension), such that it has to sacrifice the advantages of thin profile of the piezoelectric transformer. In addition, the disposition of inductor in the main circuit could cause additional power loss and electromagnetic interference (EMI).

Moreover, by not including an inductor in a piezoelectric transformer driving circuit, though it can achieve Zero-Voltage-Switching (ZVS) for a specific load range, yet the frequency range applicable is just too narrow, so that the piezoelectric transformer is not able to keep up ZVS operations under the conditions of frequency variation feedback control and large range load variations. In fact, without regard to whether piezoelectric transformer is used in cooperation with an inductor, the frequency range for the driving circuit to achieve ZVS is rather narrow. Furthermore, in actual application, piezoelectric transformer is difficult to achieve ZVS for a light load, when it is far away from resonance frequency. For this reason, the development and application of piezoelectric transformer in power supply is rather limited.

Therefore, presently, the design and performance of the piezoelectric transformer is not quite satisfactory, and it has much room for improvements.

SUMMARY OF THE INVENTION

In view of the problems and shortcomings of the prior art, the present invention provides a zero-voltage-switching (ZVS) piezoelectric driving circuit, to overcome the deficiency and drawback of the prior art.

A major objective of the present invention is to provide a zero-voltage-switching (ZVS) piezoelectric driving circuit, to utilize a shunt circuit to assist resonance in the dead time of a half-bridge switch, so as to achieve ZVS for a varying load and a varying operation frequency.

Another objective of the present invention is to provide a zero-voltage-switching (ZVS) piezoelectric driving circuit. Wherein, a shunt circuit replaces an ordinary inductor in the main current route, to reduce the space occupied and power loss, and to achieve a thin profile and raised effectiveness of the entire circuit, hereby enhancing the development and application of this technology, and competitiveness of the product.

In order to achieve the above objective, the present invention provides a a zero-voltage-switching (ZVS) piezoelectric driving circuit, comprising: a half-bridge driving circuit, a piezoelectric element, and at least a shunt circuit. The half-bridge driving circuit is used to receive an input DC voltage, and it includes a high-side switch set and a low-side switch set connected in series, to convert the input DC voltage into AC voltage through switching the high-side switch set and a low-side switch set. The piezoelectric element is connected electrically to the half-bridge driving circuit, to receive the AC voltage and drive a load. The shunt circuit is connected electrically between the half-bridge driving circuit and the piezoelectric element. The shunt circuit resonates with the half-bridge driving circuit, so that the high-side switch set and the low-side switch set perform zero-voltage-switching (ZVS).

Further scope of the applicability of the present invention will become apparent from the detailed descriptions given hereinafter. However, it should be understood that the detailed descriptions and specific examples, while indicating preferred embodiments of the present invention, are given by way of illustration only, since various changes and modifications within the spirit and scope of the present invention will become apparent to those skilled in the art from this detailed descriptions.

BRIEF DESCRIPTION OF THE DRAWINGS

The related drawings in connection with the detailed descriptions of the present invention to be made later are described briefly as follows, in which.

DETAILED DESCRIPTION OF THE PREFERRED EMBODIMENT

The purpose, construction, features, functions and advantages of the present invention can be appreciated and understood more thoroughly through the following detailed description with reference to the attached drawings.

Figure 1:
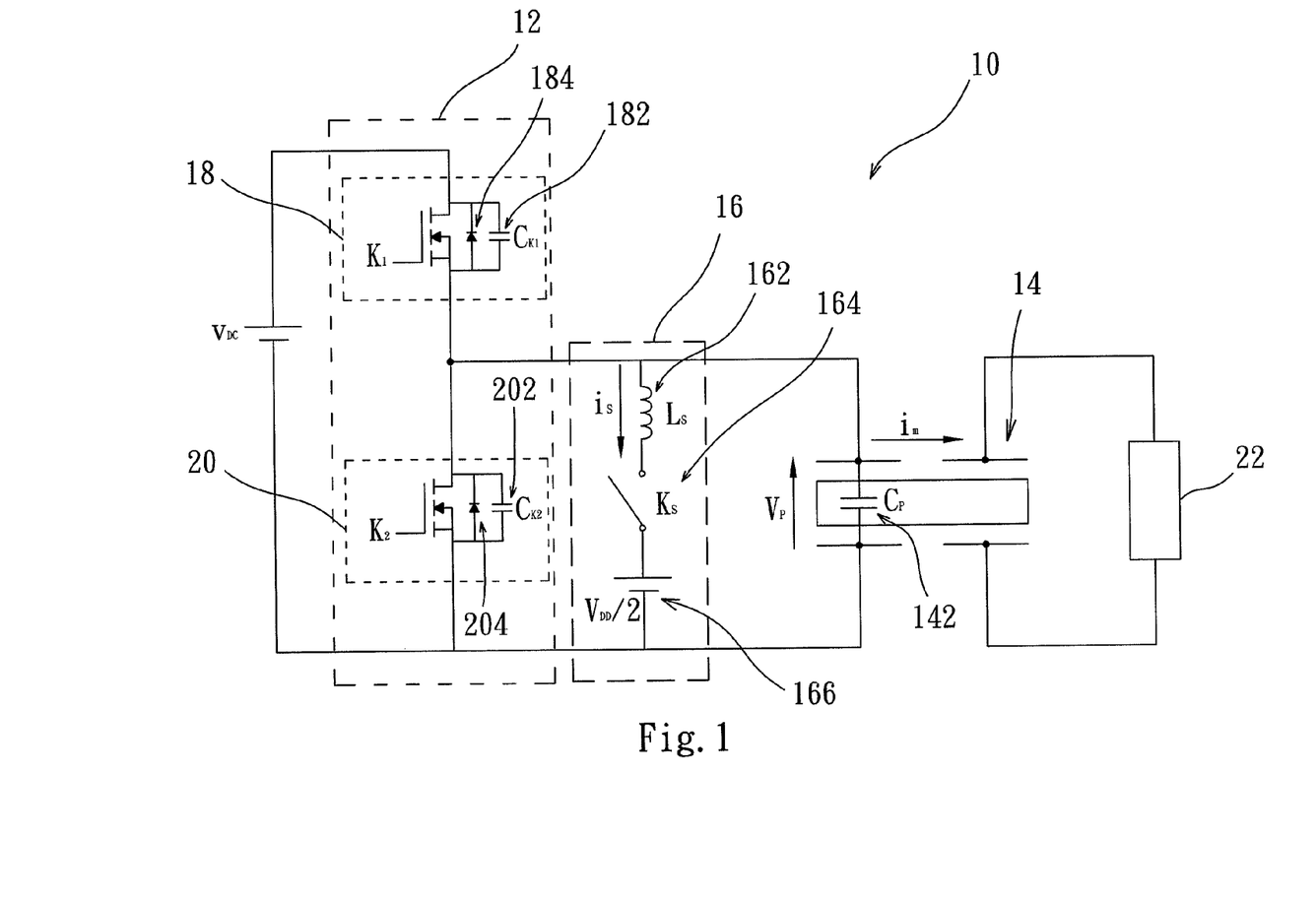
FIG. 1 is a circuit diagram of a zero-voltage-switching (ZVS) piezoelectric driving circuit according to a first embodiment of the present invention.

FIG. 1 is a circuit diagram of a zero-voltage-switching (ZVS) piezoelectric driving circuit according to a first embodiment of the present invention. As shown in FIG. 1, the zero-voltage-switching (ZVS) piezoelectric driving circuit 10 includes: a half-bridge driving circuit 12, a piezoelectric element 14, and at least a shunt circuit 16. The half-bridge driving circuit 12 includes a high-side switch set 18 and a low-side switch set 20 connected in series. The half-bridge driving circuit 12 receives an input DC voltage ($V_{DC}$), and converts it into an AC voltage of square wave through switching the high-side switch set 18 and the low-side switch set 20. The piezoelectric element 14 is connected electrically to the half-bridge driving circuit 12, to receive the AC voltage to perform resonance, and then drive a load 22 into actions.

Wherein, the load 22 can be a Cold Cathode Fluorescent Lamp (CCFL), a Hot Cathode Fluorescent Lamp (HCFL), a High Intensity Discharge (HID) Lamp, a Light-Emitting-Diode (LED), a rectifier circuit, a piezoelectric actuator, and a switching circuit. The shunt circuit 16 is connected electrically between the half-bridge driving circuit 12 and the piezoelectric element 14. The shunt circuit 16 resonates with the half-bridge driving circuit 12, such that the high-side switch set 18 and a low-side switch set 20 perform zero-voltage-switching (ZVS), and that will described in detail later.

Now, the circuit elements are described in detail, to facilitate explaining operations of the subsequent circuit. The high-side switch set 18 includes a first parasitic capacitance ($C_{K1}$) 182 and a first parasitic diode 184. The low-side switch set 20 includes a second parasitic capacitance ($C_{K2}$) 202 and a second parasitic diode 204. The piezoelectric element 14 can be a piezoelectric transformer or a piezoelectric resonator. Herein, the piezoelectric transformer is taken as an example for explanation, and it includes an input capacitor ($C_P$) 142. In the first embodiment, a set of shunt circuits 16 are taken as example for explanation, and it includes a shunt inductor ($L_S$) 162, a dual-direction switch ($K_S$) 164, and a shunt power supply ($V_{DC}/2$) 166. Wherein, the shunt power supply 166 provides a driving voltage to the dual-direction switch ($K_S$) 164, such that the DC voltage of the shunt power supply 166 is half the input DC voltage ($V_{DC}$).

Figure 2:
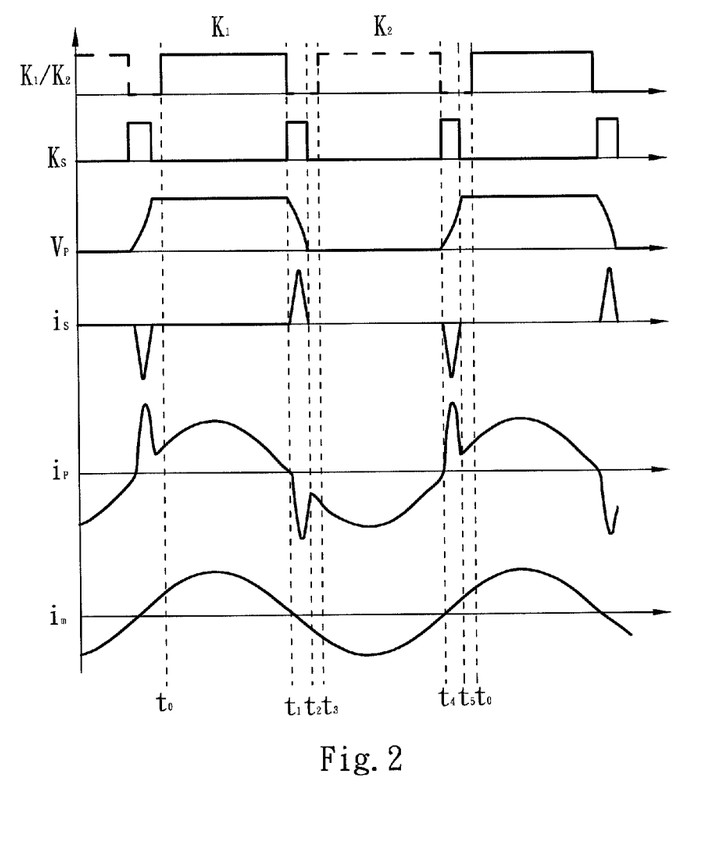
FIG. 2 is a waveform diagram of an AC voltage on a zero-voltage-switching (ZVS) piezoelectric driving circuit according to a first embodiment of the present invention.

Next, refer to FIG. 2 for a waveform diagram of an AC voltage on a zero-voltage-switching (ZVS) piezoelectric driving circuit according to a first embodiment of the present invention. Herein, the operation of the piezoelectric driving circuit 10 is described to explain how to achieve zero-voltage-switching (ZVS). Firstly, in the operation period [$t_0$-$t_1$], the high-side switch set ($K_1$) 18 is switched on, while the low-side switch set ($K_2$) 20 is switched off. At this time the shunt circuit 16 is turned off, therefore the input current ip flows to the piezoelectric element 14, and voltage Vp across the input capacitor 142 is equal to the input DC voltage ($V_{DC}$), and that voltage is positive. At the end of this operation period, the dual-direction switch 164 of the shunt circuit 16 is still switched off.

Then, in the operation period [$t_1$-$t_2$], the high-side switch set 18 and the low-side switch set 20 are both switched off, and this period is the dead time of the conventional half-bridge circuit. At this time, the shunt circuit 16 is turned on, such that the input capacitor 142, the second parasitic capacitance 202, the first parasitic capacitance 182, and the shunt inductor 162 start to resonate, so that the input capacitor 142 and the second parasitic capacitance 202 start to resonate and discharge through the shunt circuit 16. Meanwhile, the first parasitic capacitance 182 starts to resonate and is charged. It is worth to note that, the voltage $V_P$ across the input capacitor 142 decrements to zero voltage by a positive and sinusoidal slope, while the voltage across the high-side switch set 18 increments to the level of the input DC voltage ($V_{DC}$), such that it could serve as the critical condition for the zero-voltage-switching (ZVS) of the low-side switch set 20. Of course, in case in the operation period [$t_1$-$t_2$], when the resonance discharge current is not sufficiently large, then the input capacitor 142 and the second parasitic capacitance 202 are not able to discharge completely to zero, such that the low-side switch set 20 is not able to perform zero-voltage-switching-on in the next operation period. Wherein, the resonance period [$t_1$-$t_2$] of the shunt inductor 162 and the total capacitance can be obtained through the following equation 1:

$$t_2 - t_1 = \pi\sqrt{L_S(C_P + C_{K1} + C_{K2})} \qquad (1)$$

Since usually, the operation period [$t_1$-$t_2$] is rather short, so during resonance, a small inductor (shunt inductor 162) can be used directly on the shunt circuit 16 to match the total capacitance on the piezoelectric driving circuit 10. In order to make the entire circuit thinner, the parasitic inductance produced on the conduction wire of the shunt circuit 16, or the minute inductance produced by the wire on the printed-circuit-board (PCB) of the shunt circuit 16, can be used to match the input capacitor 142, the first parasitic capacitance 182, and the second parasitic capacitance 202 to perform resonance. When the voltage $V_P$ across the input capacitor 142 is discharged to zero, that operation period is over.

Subsequently, in the operation period [$t_2$-$t_3$], the high-side switch set 18, the low-side switch set 20, and the shunt circuits 16 are switched off at the same time. In this operation period, the second parasitic diode 204 of the low-side switch set 20 is turned on, to provide current $i_m$ to flow through the piezoelectric element 14. When the low-side switch set 20 starts to be switched on, that operation period is over.

Then, in the operation period [$t_3$-$t_4$], the high-side switch set 18 is switched off, while the low-side switch set 20 is switched on. At this time, the shunt circuit 16 is still turned off. When the high-side switch set 18 is switched from switching off to switching on, the input voltage of the piezoelectric element 14 is zero, namely, the voltage $V_P$ across the input capacitor 142 is zero, and it will remain at zero after it is switched, thus achieving zero-voltage-switching (ZVS). When the low-side switch set 20 is switched off, this operation period is over.

Moreover, in the operation period [$t_4$-$t_5$], the high-side switch set 18 and the low-side switch set 20 are both switched off. At this time, the shunt circuit 16 starts to be turned on, the same as that in the operation period [$t_1$-$t_2$]. The input capacitor 142, the second parasitic capacitance 202, the first parasitic capacitance 182, and the shunt inductor 162 starts to resonate, so that the input capacitor 142, the second parasitic capacitance 202 start to resonate and discharge through the shunt circuit 16, meanwhile the first parasitic capacitance 182 starts to resonate and is charged. Wherein, the resonance period [$t_4$-$t_5$] of the shunt inductor 162 and the total capacitance can be obtained through the following equation (2):

$$t_5 - t_4 = \pi\sqrt{L_S(C_P + C_{K1} + C_{K2})} \qquad (2)$$

During resonance, the voltage $V_P$ across the input capacitor 142 increments to the level of input DC voltage ($V_{DC}$) by a positive and sinusoidal slope, while the voltage across the high-side switch set 18 decrements to zero voltage by a positive and sinusoidal slope, such that it could serve as the critical condition for the zero-voltage-switching (ZVS) of high-side switch set 18. Of course, in case in the operation period [$t_4$-$t_5$], when the resonance discharge current is not sufficiently large, then the input capacitor 142 is not able to discharge completely to zero, such that the high-side switch set 18 is not able to perform zero-voltage-switching-on in the next operation period. When the voltage $V_P$ across the input capacitor 142 is charged to the level of the input DC voltage ($V_{DC}$), that operation period is over.

Then, in the operation period [$t_5$-$t_0$], the high-side switch set 18, the low-side switch set 20, and the shunt circuits 16 are switched off at the same time. At this time, the voltage $V_P$ across the input capacitor 142 starts to be charged to the level of input DC voltage ($V_{DC}$). Meanwhile, the first parasitic diode 184 of the high-side switch set 18 is turned on, to provide current $i_m$ to flow through the piezoelectric element 14. When the high-side switch set 18 is switched on, that operation period is over. Since when the high-side switch set 18 is switched from switch-off to switch-on, the input voltage $V_P$ of the piezoelectric element 14 is charged to the level of input DC voltage ($V_{DC}$), and it will remain at $V_{DC}$ after it is switched, thus achieving zero-voltage-switching (ZVS).

From the operation periods described above, it can be known that, the high-side switch set 18 and the low-side switch set 20 are switched on respectively in operation period [$t_0$-$t_1$] and operation period [$t_3$-$t_4$]. In other operation period, the high-side switch set 18 and the low-side switch set 20 are both switched off, and this is the dead times of half-bridge driving circuit 12. During operation periods [$t_1$-$t_2$] and [$t_4$-$t_5$], the input capacitor 142, the second parasitic capacitance 202, the first parasitic capacitance 182, and the shunt inductor 162 start to resonate to charge, or it is discharged through the shunt circuit 16, to achieve zero-voltage-switching (ZVS). Another approach to achieve zero-voltage-switching (ZVS) is that, when the second parasitic diode 204 of the low-side switch set 20, and the first parasitic diode 184 of the high-side switch set 18 are operated in the corresponding operation periods [$t_2$-$t_3$] and [$t_5$-$t_0$], and they provide the current $i_m$ to flow through the piezoelectric element 14, while the load 22 is put into action through receiving energy transferred by the current $i_m$ from the piezoelectric element 14. It is worth to note that, the piezoelectric element 14 and the shunt circuit 16 do not have direct relations in operation. The piezoelectric element 14 is driven by the square waves generated by the high-side switch set 18 and the low-side switch set 20; while the shunt circuit 16 is used for zero-voltage-switching (ZVS) only.

Wherein, the present invention uses shunt circuit 16 to enable the half-bridge driving circuit 12 to achieve zero-voltage-switching (ZVS), but it has first to satisfy the following two conditions, as shown in equations (3) to (6):

1. A sufficiently long dead time $t_d$, namely $t_d$ is equal to the operation periods [$t_1$-$t_3$] or [$t_4$-$t_0$]

$$t_d > \pi \sqrt{L_S(C_p + C_{K1} + C_{K2})} \tag{3}$$

2. Sufficient amount of charging and discharging charges Q:

$$Q > \int_0^{T_s} |i_s| dt \tag{4}$$

$$T_s = \pi \sqrt{L_s(C_p + C_{K1} + C_{K2})} \tag{5}$$

$$|i_s| = \frac{V_{DC}}{2\sqrt{L_s/C_1}} \sin \frac{2\pi}{T_s} t \tag{6}$$

Wherein, $K_S$ is dual-direction switch 164, $T_S$ is the switching-on period of the dual-direction switch 164, such as the operation period [$t_1$-$t_2$] or [$t_4$-$t_5$]; and $i_S$ is the current of shunt circuit 16.

From equations (3) to (6), it can be known that, the two conditions of zero-voltage-switching (ZVS) are: a sufficiently long dead time and a sufficiently large current $i_s$ of the shunt circuit 16, and they are not related to other factors (such as frequency and load). The current $i_s$ of the shunt circuit 16 is determined based on the input DC voltage ($V_{DC}$), shunt inductor 162 ($L_S$) and input capacitor 142 ($C_P$), the first parasitic capacitance 182 ($C_{K1}$), the second parasitic capacitance 202 ($C_{K2}$), and they are all the conventional elements. Therefore, when the dead time is fixed, then the conditions for zero-voltage-switching (ZVS) are fixed, and they are not related to operation frequency and load, to achieve wide bandwidth of zero-voltage-switching (ZVS). Wherein, the corresponding frequency for period $t_d$ is $1/t_d$, such that the upper limit of operation frequency of the shunt circuit 16 is $1/t_d$.

Figure 3:
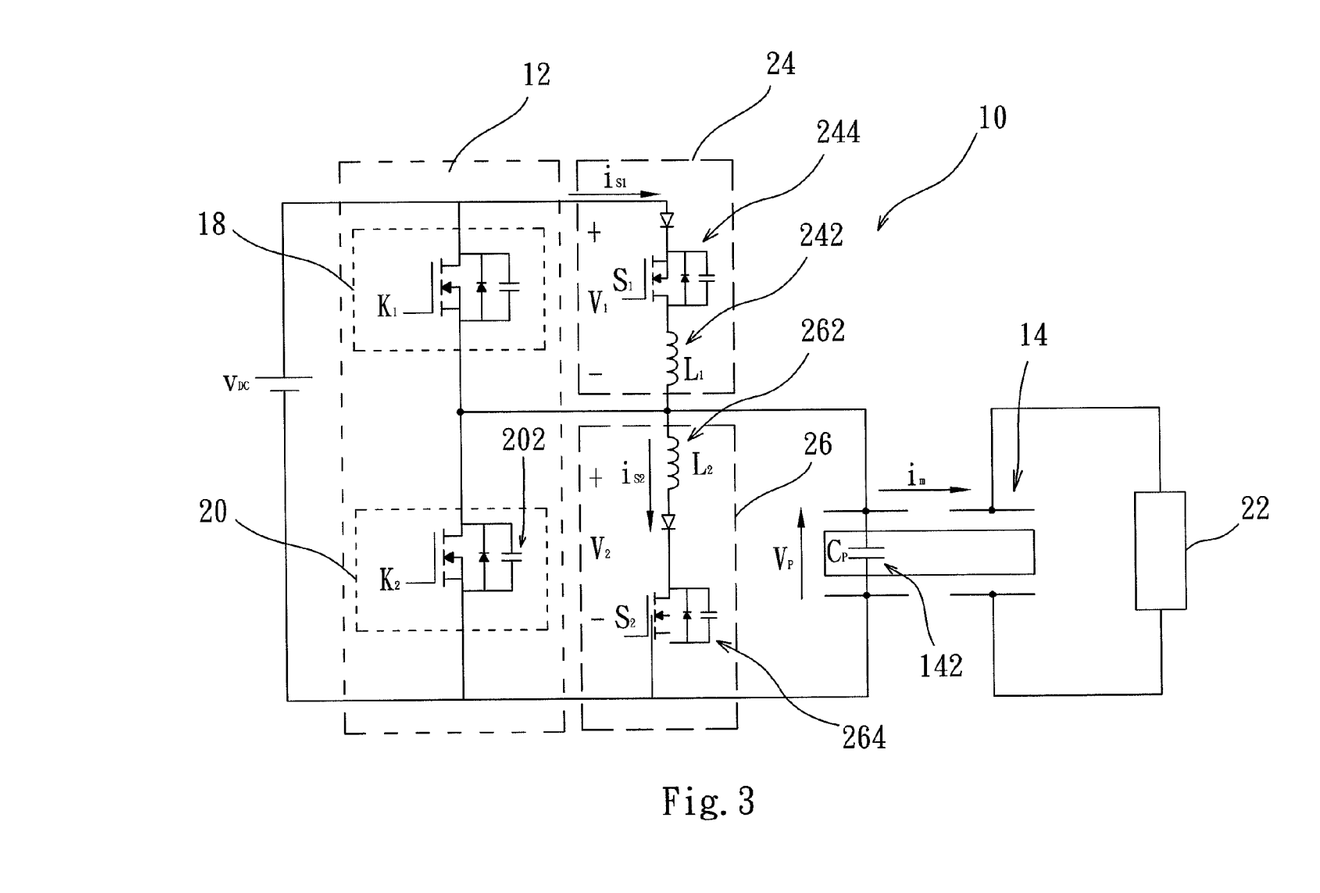
FIG. 3 is a circuit diagram of a zero-voltage-switching (ZVS) piezoelectric driving circuit according to a second embodiment of the present invention.

Then, refer to FIG. 3 for a circuit diagram of a zero-voltage-switching (ZVS) piezoelectric driving circuit according to a second embodiment of the present invention. As shown in FIG. 3, the difference between the second embodiment and the first embodiment of the present invention is that, the second embodiment is in fact a design of a dual-direction switch incorporating a half-bridge driving circuit, namely, the shunt circuit is designed into two groups. To be more specific, in the piezoelectric driving circuit 10, two shunt circuits are connected electrically between the half-bridge driving circuit 12 and the piezoelectric element 14, namely, a first shunt circuit 24 and a second shunt circuit 26. The first shunt circuit 24 includes a first shunt inductor 242 ($L_1$) and a first single-direction switch 244 ($S_1$) connected in series. The second shunt circuit 26 is connected to the first shunt circuit 24. The second shunt circuit 26 includes a second shunt inductor 262 ($L_2$) and a second single-direction switch 264 ($S_2$) connected in series. Wherein, the compositions of the half-bridge driving circuit 12 and the piezoelectric element 14 are the same as the first embodiment, and they will not be repeated here for brevity. It is worth to note that, the first shunt circuit 24 is connected directly to the input DC voltage ($V_{DC}$), to be used as driving voltage $V_1$, while the second shunt circuit 26 is connected directly to ground (0V), to be used as driving voltage $V_2$. As such, in the present invention, outside power supply can be omitted, to simplify the overall circuit design.

Figure 4:
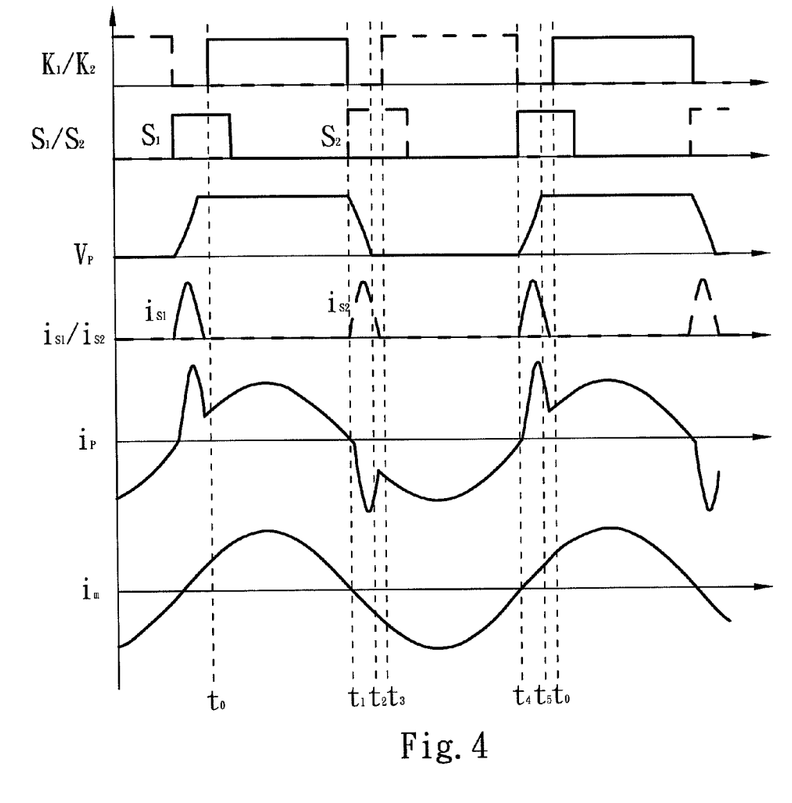
FIG. 4 is a waveform diagram of an AC voltage on a zero-voltage-switching (ZVS) piezoelectric driving circuit according to a second embodiment of the present invention.

Subsequently, refer to FIG. 4 for a waveform diagram of an AC voltage on a zero-voltage-switching (ZVS) piezoelectric driving circuit according to a second embodiment of the present invention. Herein, the operation of the piezoelectric driving circuit 10 is described as to how to achieve zero-voltage-switching (ZVS). Firstly, in the operation period [$t_0$-$t_1$], the high-side switch set ($K_1$) 18 is switched on, while the low-side switch set ($K_2$) 20 is switched off. At this time, the first shunt circuit 24 and the second shunt circuit 26 are turned off. Therefore the input current $i_p$ flows to the piezoelectric element 14, and voltage Vp across the input capacitor 142 is equal to the input DC voltage ($V_{DC}$), and that voltage is positive. At the end of this operation period, the first single-direction switch 244 and the second single-direction switch 264 are still switched off.

Then, in the operation period [$t_1$-$t_2$], when the high-side switch set 18 and the low-side switch set 20 are both switched off at the same time, while the first shunt circuit 24 is still turned off, but the low-side switch set 20 will be switched on at the time $t_1$=$t_2$. At this time, the input capacitor 142, the second parasitic capacitance 202, the first parasitic capacitance 182, and the second shunt inductor 262 starts to resonate, while the input capacitor 142 and the second parasitic capacitance 202 start to resonate and discharge through the second shunt circuit 26. Meanwhile, the first parasitic capacitance 182 starts to resonate and is charged. It is worth to note that, the voltage $V_P$ across the input capacitor 142 decrements to zero voltage by a positive and sinusoidal slope, while the voltage across the high-side switch set 18 will increment to the level of the input DC voltage ($V_{DC}$), such that it could serve as the critical condition for the zero-voltage-switching (ZVS) of the low-side switch set 20. Of course, in case in the operation period [$t_1$-$t_2$], the resonance discharge current is not sufficiently large, then the input capacitor 142 and the second parasitic capacitance 202 are not able to discharge completely to zero, such that the low-side switch set 20 is not able to perform zero-voltage-switching-on in the next operation period. Wherein, the resonance period [$t_1$-$t_2$] of the second shunt inductor 262 and the total capacitance can be obtained through the following equation 7:

$$t_5 - t_4 > \pi\sqrt{L_S(C_P + C_{K1} + C_{K2})} \qquad (7)$$

Since usually, the operation period [$t_1$-$t_2$] is rather short, so during resonance, a small inductor can be used directly on the first shunt circuit 24 and the second shunt circuit 26 to match the total capacitance on the piezoelectric driving circuit 10. When the voltage $V_P$ across the input capacitor 142 is discharged to zero, that operation period is over.

Subsequently, in the operation period [$t_2$-$t_3$], the high-side switch set 18, the low-side switch set 20, and the first shunt circuit 24 are switched off at the same time. During the operation period $t_1$=$t_2$, the second single-direction switch 264 of the second shunt circuit 26 is still switched on, but the voltage $V_P$ across input capacitor 142 becomes zero. At this time, the second parasitic diode 204 of the low-side switch set 20 is switched on, to provide current $i_m$ to flow through the piezoelectric element 14. Meanwhile, the remaining current ($i_{S2}$) on the second shunt inductor 262 is discharged linearly. When the charges on the second shunt inductor 262 are discharged completely, the second shunt circuit 26 is turned off automatically. Then, the second single-direction switch 264 can be switched off in the present operation period or the next operation period under the condition of zero-voltage-switching (ZVS), since no current flows through the second shunt circuit 26. In fact, in the next operation period, the second single-direction switch 264 is switched off at a slower switching speed. When the low-side switch set 20 starts to be switched on, that operation period is over.

Then, in the operation period [$t_3$-$t_4$], the high-side switch set 18 and the low-side switch set 20 are both switched on. At this time, the first shunt circuit 24 and the second shunt circuit 26 are both turned off. Therefore, the input voltage of the piezoelectric element 14 is zero, namely, voltage $V_P$ across the input capacitor 142 is zero. When the low-side switch set 20 is switched to a switch-off, that operation period is over.

Further, in the operation period [$t_4$-$t_5$], the high-side switch set 18 and the low-side switch set 20 are both switched off. At this time, the second shunt circuit 24 is still turned off, such that at operation period t=$t_4$, the first single-direction switch 244 starts to be switched on. The same as in operation period [$t_1$-$t_2$], the input capacitor 142, the second parasitic capacitance 202, the first parasitic capacitance 182, and the second shunt inductor 264 start to resonate, so that the input capacitor 142 and the second parasitic capacitance 202 start to resonate and charge through the first shunt circuit 24. Meanwhile, the first parasitic capacitance 182 starts to resonate and discharge. Therefore, during resonance, the voltage $V_P$ across the input capacitor 142 increments to the level of the input DC voltage ($V_{DC}$) by a positive and sinusoidal slope, while the voltage across the high-side switch set 18 decrements to zero voltage by a positive and sinusoidal slope, such that it could serve as the critical condition for the zero-voltage-switching (ZVS) of the high-side switch set 18. Of course, in case in the operation period [$t_4$-$t_5$], the resonance discharge current is not sufficiently large, then the input capacitor 142 is not able to discharge completely to zero, such that the high-side switch set 18 is not able to perform zero-voltage-switching-on in the next operation period. When the voltage $V_P$ across the input capacitor 142 is charged to the level of the input DC voltage ($V_{DC}$), that operation period is over.

Then, in the operation period [$t_5$-$t_0$], the high-side switch set 18, the low-side switch set 20, and the first shunt circuit 24 are switched off at the same time, while the first single-direction switch 244 is still switched on. At this time, the voltage $V_P$ across the input capacitor 142 starts to be charged to the level of input DC voltage ($V_{DC}$). At the same time, the first parasitic diode 184 of the high-side switch set 18 is turned on, to provide the current $i_m$ to flow through the piezoelectric element 14. Meanwhile, the remaining current ($i_{s1}$) on the first shunt inductor 242 is discharged linearly to zero, and the second shunt circuit 26 is turned off automatically. When the low-side switch set 20 starts to be switched on, that operation period is over.

From the operation periods of the second embodiment described above, it can be known that, the high-side switch set 18 and the low-side switch set 20 are switched on respectively in operation periods [$t_0$-$t_1$] and [$t_3$-$t_4$]. In other operation periods, the high-side switch set 18 and the low-side switch set 20 are switched off, and this is the dead time of half-bridge driving circuit 12. During operation periods [$t_1$-$t_2$] and [$t_4$-$t_5$], the input capacitor 142, the second parasitic capacitance 202, the first parasitic capacitance 182, and the first shunt inductor 242, and the second shunt inductor 262 start to resonate to charge, or they are discharged through the first shunt inductor 242 and the second shunt inductor 262, to achieve zero-voltage-switching (ZVS). Another approach to achieve zero-voltage-switching (ZVS) is that, when the second parasitic diode 204 of the low-side switch set 20, and the first parasitic diode 184 of the high-side switch set 18 are operated in the corresponding operation period [$t_2$-$t_3$] and operation period [$t_5$-$t_0$], the remaining current ($i_{S1}$ and $i_{S2}$) on the first shunt circuit 24 and the second shunt circuit 26 will be discharged.

Figure 5:
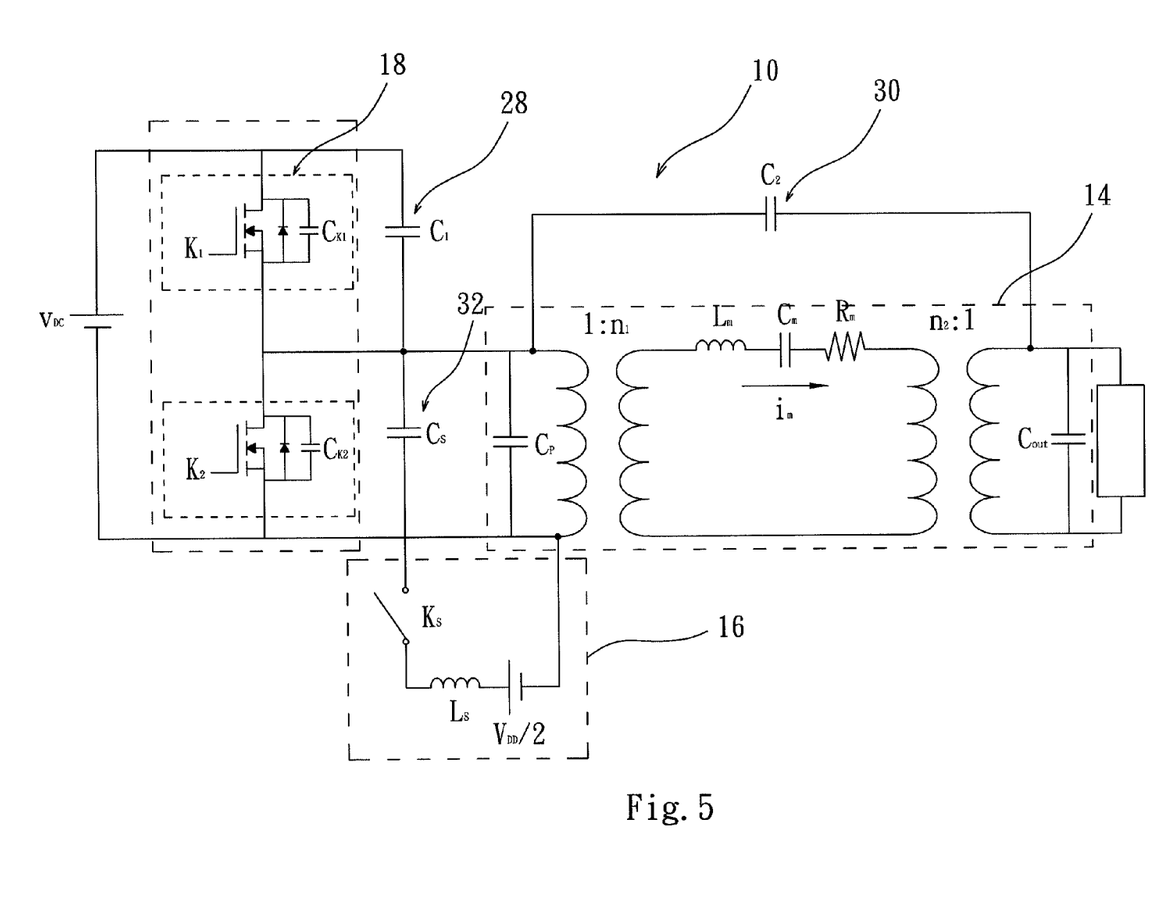
FIG. 5 is a circuit diagram of a zero-voltage-switching (ZVS) piezoelectric driving circuit according to a third embodiment of the present invention.

Further, refer to FIG. 5 for a circuit diagram of a zero-voltage-switching (ZVS) piezoelectric driving circuit according to a third embodiment of the present invention. The difference between the third embodiment and the first embodiment is that, in the third embodiment, a first capacitor ($C_1$) 28, a second capacitor ($C_2$) 30, and a shunt capacitor ($C_S$) 32 are added. Wherein, the high-side switch set 18 is connected to the first capacitor 28 in parallel, and the piezoelectric element 14 is connected to the second capacitor 30 in parallel. As shown in the equivalent circuit in FIG. 5, the shunt capacitor 32 is connected in series between the first capacitor 28 and the shunt circuit 16. Wherein, the second capacitor 30 is capable of changing the value of shunt current $i_S$ in the shunt circuit 16, and the resonance frequency ($f_S$) of the first capacitor 28 and the shunt circuit 16. The first capacitor 28 and the second capacitor 30 can be used to reduce the resonance frequency ($f_S$), and increase the current $i_S$ in the shunt circuit 16. Meanwhile, the shunt capacitor 32 can be used to increase the resonance frequency ($f_S$), and reduce the current $i_S$ in the shunt circuit 16. The addition of the capacitors mentioned above is capable of making design of the zero-voltage-switching (ZVS) of the piezoelectric driving circuit 10 more flexible.

Figure 6:
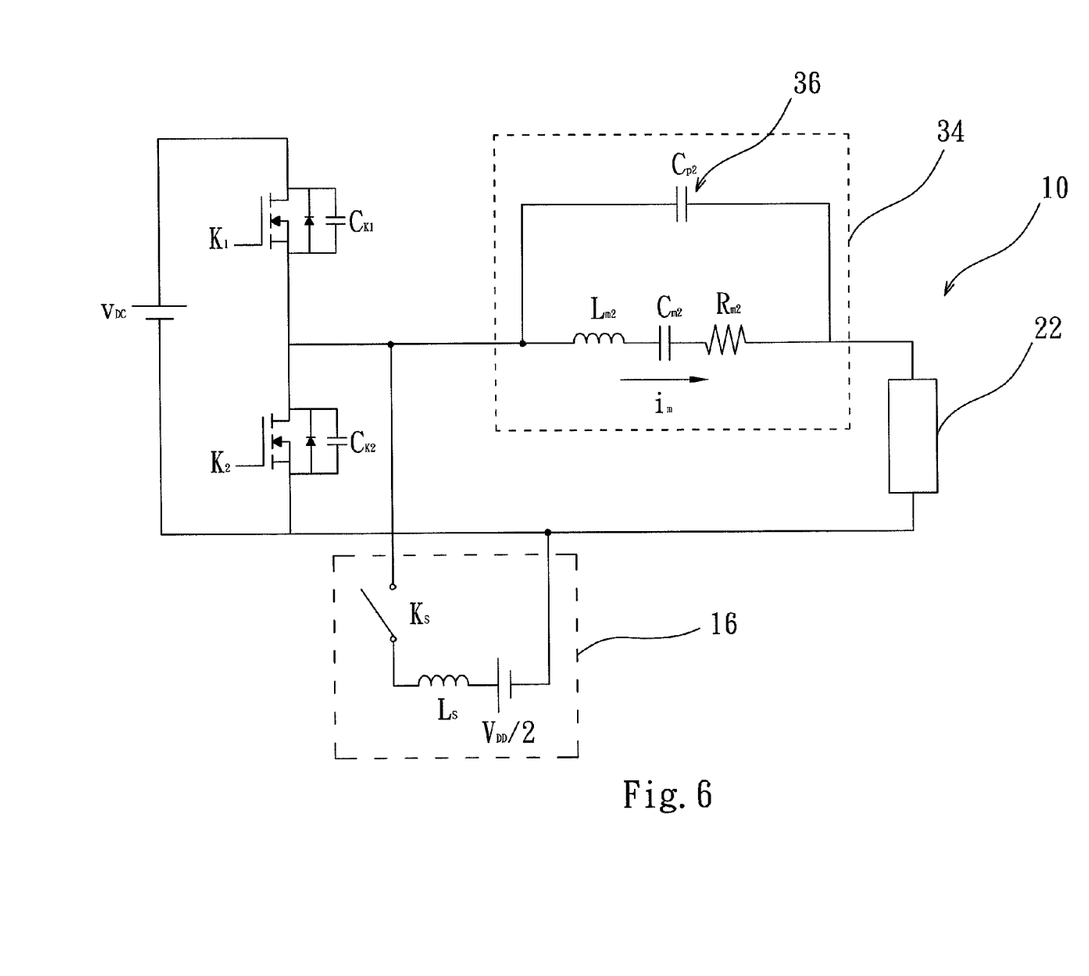
FIG. 6 is a circuit diagram of a zero-voltage-switching (ZVS) piezoelectric driving circuit according to a fourth embodiment of the present invention.

Finally, refer to FIG. 6 for a circuit diagram of a zero-voltage-switching (ZVS) piezoelectric driving circuit according to a fourth embodiment of the present invention. As shown in FIG. 6, the difference between the fourth embodiment and the third embodiment is that, in the fourth embodiment, the piezoelectric element is a piezoelectric resonator 34, such that a third capacitor ($C_{P2}$) 36 replaces the second capacitor ($C_2$), and the mechanical resonance $L_m$-$C_m$-$R_m$ of the original piezoelectric transformer is replaced by the mechanical resonance $L_{m2}$-$C_{m2}$-$R_{m2}$ of the piezoelectric resonator 34. In brief, the piezoelectric resonator 34 replaces the piezoelectric transformer to transfer energy, thus eliminating the output capacitor ($C_{out}$) of the original piezoelectric transformer. To be more specific, for the original piezoelectric transformer, the current $i_m$ will flow into the output capacitor ($C_{out}$) and the load 22, while in the example of piezoelectric resonator 34, current $i_m$ will flow directly into the load 22. Since current $i_m$ (vibration speed) is the physical restriction of piezoelectric resonator, in the condition of the same current $i_m$, piezoelectric resonator 34 is able to obtain more watts of output power for the load 22, thus simplifying even more the entire circuit design.

Summing up the above, in the piezoelectric transformer driving circuit of the prior art, Zero-Voltage-Switching (ZVS) can not be maintained for frequency variation feedback control and large range load variations, and frequency range applicable is too narrow, as such limiting the development and application of that technology. For this reason, the present invention proposes to use shunt circuit to replace bulky inductor, and also utilizes the shunt circuit to assist resonance in the dead time of the half-bridge switch, so that Zero-Voltage-Switching (ZVS) can be maintained for varying load and varying operation frequency. Moreover, shunt circuit replaces the ordinary inductor in the main current route to save the space occupied and reduce the energy loss. As such, the entire circuit can be of a thinner profile, while its effectiveness is raised, that is beneficial to the development and application of the technology, and the competitiveness of the product.

The above detailed description of the preferred embodiment is intended to describe more clearly the characteristics and spirit of the present invention. However, the preferred embodiments disclosed above are not intended to be any restrictions to the scope of the present invention. Conversely, its purpose is to include the various changes and equivalent arrangements which are within the scope of the appended claims.

What is claimed is:

1. A zero-voltage-switching (ZVS) piezoelectric driving circuit, comprising:
    a half-bridge driving circuit, used to receive an input DC voltage, and includes:
        a high-side switch set and a low-side switch set connected in series, to convert said input DC voltage into an AC voltage through switching of said high-side switch set and said low-side switch set;
    a piezoelectric element, connected electrically to said half-bridge driving circuit, to receive said AC voltage, and drive a load into action; and
    at least a shunt circuit, connected electrically between said half-bridge driving circuit and said piezoelectric element, said shunt circuit resonates with said half-bridge driving circuit, so that said high-side switch set and said low-side switch set perform zero-voltage-switching (ZVS), wherein said high-side switch set includes a first parasitic capacitance, and said low-side switch set includes a second parasitic capacitance, when said high-side switch set and said low-side switch set are switched off, said shunt circuit is turned on, an input capacitor and said second parasitic capacitance of said piezoelectric element discharge through said shunt circuit, while said first parasitic capacitance is charged, wherein said shunt circuit includes a shunt inductor, a dual-direction switch, and a shunt power supply connected in series, when said shunt inductor, said first parasitic capacitance, said second parasitic capacitance, and said input capacitor start to resonate, input AC voltage of said piezoelectric element decrements to zero voltage, while voltage across said high-side switch set increments to level of said input DC voltage.

2. The zero-voltage-switching (ZVS) piezoelectric driving circuit as claimed in claim 1, wherein when said high-side switch set and said low-side switch set are at dead time of both switching off, said shunt circuit is turned on, such that said high-side switch set and said low-side switch set start to resonate to charge or discharge, and during turning on of said shunt circuit, voltage of charging is equal to said input DC voltage, or voltage of discharging is zero voltage, so that said high-side switch set and said low-side switch set perform zero-voltage-switching (ZVS).

3. The zero-voltage-switching (ZVS) piezoelectric driving circuit as claimed in claim 1, wherein said shunt inductor is parasitic inductance on the wire of said shunt circuit, or said shunt inductance produced by route of wire on a PCB of said shunt circuit.

4. The zero-voltage-switching (ZVS) piezoelectric driving circuit as claimed in claim 1, wherein said shunt power supply provides a driving voltage to said dual-direction switch, DC voltage of said shunt power supply is a half of said input DC voltage.

5. The zero-voltage-switching (ZVS) piezoelectric driving circuit as claimed in claim 1, wherein when there are two said shunt circuits, they are a first shunt circuit and a second shunt circuit respectively, said first shunt circuit includes a first shunt inductor and a first single-direction switch connected in series, said second shunt circuit is connected to said first shunt circuit, and said second shunt circuit includes a second shunt inductor and a second single-direction switch connected in series.

6. The zero-voltage-switching (ZVS) piezoelectric driving circuit as claimed in claim 5, wherein when said low-side switch set is switched on, said first shunt inductor, said second shunt inductor and said first parasitic capacitance, said second parasitic capacitance, and said input capacitor start to resonate, said input capacitor and said second parasitic capacitance discharge through said second shunt inductor, a second parasitic diode, and said second single-direction switch, meanwhile said first parasitic capacitance is charged, at this time, said input AC voltage of said piezoelectric element decrements to zero voltage, while voltage across said high-side switch set increments to level of said input DC voltage; and
    when said high-side switch set is switched on, said first shunt inductor, said second shunt inductor and said first parasitic capacitance, said second parasitic capacitance, and said input capacitor start to resonate, said input capacitor and said second parasitic capacitance are charged through said first shunt inductor, a first parasitic diode, and said first single-direction switch, meanwhile said first parasitic capacitance discharges, at this time, said input AC voltage of said piezoelectric element increments to level of said input DC voltage, while voltage across said high-side switch set decrements to zero voltage.

7. The zero-voltage-switching (ZVS) piezoelectric driving circuit as claimed in claim 1, wherein said piezoelectric element is a piezoelectric transformer or a piezoelectric resonator.

8. The zero-voltage-switching (ZVS) piezoelectric driving circuit as claimed in claim 1, wherein said high-side switch set is connected to a first capacitor in parallel, said piezoelectric element is connected to a second capacitor in parallel, and a shunt capacitor is connected in series between said first capacitor and said shunt circuit, such that said second capacitor changes shunt current in said shunt circuit, and resonance frequency of said first capacitor and said shunt circuit.

* * * * *